United States Patent [19]

Duret

[11] Patent Number: 5,404,103

[45] Date of Patent: Apr. 4, 1995

[54] MULTIAXIAL RESONANCE MAGNETOMETER

[75] Inventor: Denis Duret, Grenoble, France

[73] Assignee: Commissariat a l'Energie Atomique, Paris, France

[21] Appl. No.: 202,595

[22] Filed: Feb. 28, 1994

[30] Foreign Application Priority Data

Mar. 16, 1993 [FR] France .................. 93 03009

[51] Int. Cl.$^6$ ................................. G01V 3/00
[52] U.S. Cl. ..................... 324/301; 324/300
[58] Field of Search .......... 324/300, 301, 304, 305, 324/307

[56] References Cited

U.S. PATENT DOCUMENTS

| | | | |
|---|---|---|---|
| 4,623,844 | 11/1986 | Macovski | 324/320 |
| 5,187,438 | 2/1993 | Alcouffe et al. | 324/301 |
| 5,221,897 | 6/1993 | Duret et al. | 324/302 |
| 5,272,436 | 12/1993 | Chaillout et al. | 324/301 |
| 5,296,802 | 3/1994 | Beranger et al. | 324/117 R |

FOREIGN PATENT DOCUMENTS

| | | |
|---|---|---|
| 3530784 | 5/1985 | Australia . |
| 0463919 | 1/1992 | European Pat. Off. . |
| 512744 | 10/1971 | Switzerland . |

OTHER PUBLICATIONS

Optics and Spectroscopy, vol. 59, No. 2, pp. 270-271, Aug. 1985, V. M. Lopatin, et al., "Spin Generator Based on Inert Gas Nuclei".

IEEE Transactions on Magnetics, vol. 27, No. 6, pp. 5405-5407, Nov. 1991, D. Duret, et al., "Use of High Performance Electron Spin Resonance Materials for the Design of Scalar and Vectorial Magnetometers".

IEEE Transactions on Geoscience Electronics, vol. GE-16, No. 2, pp. 134-137, Apr. 1978, R. L. McPherron, et al., "A Procedure for Accurate Calibration of the Orientation of the Three Sensors in a Vector Magnetometer".

Primary Examiner—Louis Arana
Attorney, Agent, or Firm—Oblon, Spivak, McClelland, Maier & Neustadt

[57] ABSTRACT

Multiaxial resonance magnetometer. The magnetometer according to the invention incorporates means (40, 50, 60, Wx, Wy, Wz) for the sequential application of polarization fields having different directions. It then supplies (70) the components (Hmx, Hmy, Hmz) of the ambient field in accordance with these directions. Application in magnetometry.

7 Claims, 9 Drawing Sheets

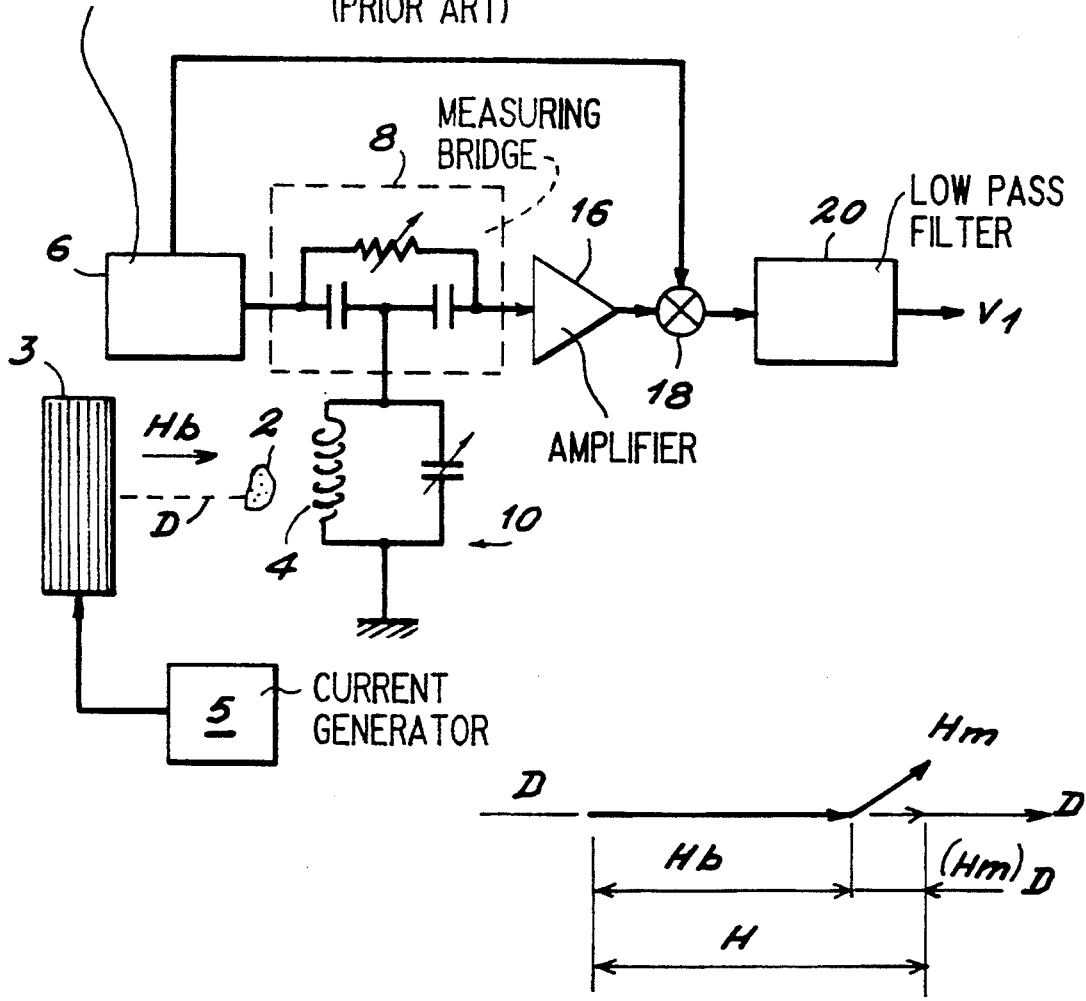
FIG. 1 (PRIOR ART)
FIG. 2 (PRIOR ART)
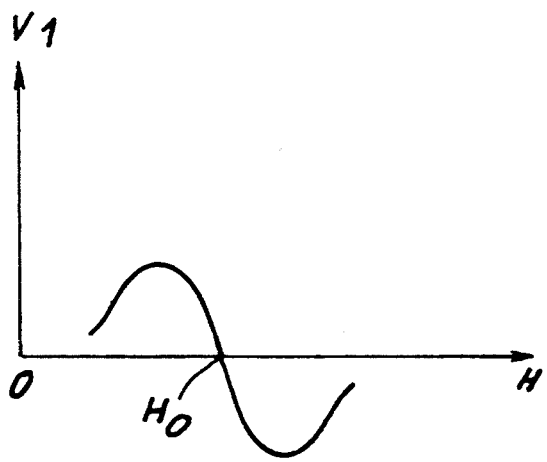
FIG. 3 (PRIOR ART)

MULTIAXIAL RESONANCE MAGNETOMETER

PRIOR ART

The present invention relates to a multiaxial resonance magnetometer. It is used in the measurement of weak magnetic fields, e.g. of a few dozen microteslas.

The invention is applied in geophysics, mining prospecting, space detection, etc.

The magnetometer according to the invention is of the directional resonance type. These apparatuses are well known and are e.g. described in French patent application FR-A-2 663 751 filed by the present applicant (said application containing bibliographical references on the subject) or in the corresponding European patent application EP-A-463 919, or in the article by D. DURET, M. MOUSSAVI and M. BERANGER entitled "Use of High Performance Electron Spin Resonance Materials for the Design of Scalar and Vectorial Magnetometers", published in IEEE Transactions on Magnetics, vol.27, no.6, November 1991, pp.5405-5407.

The structure and operation of these apparatuses will briefly be described in certain of their variants with reference to the attached FIGS. 1 to 6.

Firstly, in FIG. 1, it is possible to see a sample 2 containing a material having electron or nuclear spins, a first winding 3 producing a magnetic polarization field Hb directed in direction D, a second winding 4 in the vicinity of the sample 2, a current generator 5 having a regulatable intensity supplying the first winding 3, a high frequency generator 6 connected to a measuring bridge 8, which is in turn connected to a resonant circuit 10 containing the winding 4, a low noise amplifier 16 connected to the measuring bridge 8, a balance mixer 18 receiving on the one hand the voltage supplied by the amplifier 16 and on the other a reference voltage from the high frequency generator 6 and finally a low pass filter 20.

The sample 2 is subject to the field to be measured Hm, as well as to the polarization field Hb. These two fields are not generally colinear. The magnetic field measured by such an apparatus is the sum of Hb and the component of Hm projected in the direction D and which is designated $(Hm)_D$, bearing in mind that Hb is much greater than Hm. These different fields or components are shown in FIG. 2. The total field in the direction D is designated H.

The apparatus functions as follows. The generator 6, connected to the circuit 10 and to its winding 4, is able to excite the resonance of the spins of the sample 2. Its frequency is very accurately fixed ($10^{-9}$ to $10^{-6}$). The resonance of the spins occurs when the frequency fo of the excitation signal is equal to the LARMOR frequency, conventionally determined by the relation $(1/(2\pi))\gamma Ho$, in which $\gamma$ is the gyromagnetic ratio of the sample used (in the case of the electron $\gamma=2\pi\cdot 28$ GHz/T) and Ho is the value at resonance of the total magnetic field applied.

At the same time the circuit 10 and its winding 4 are able to detect this resonance, the function of the circuit 8 being to separate the excitation and the detection.

The apparatus shown in FIG. 1 detects the passage through the resonance when, the frequency fo being fixed, the total field H passes through the value Ho. Thus, FIG. 3 shows the variations of the voltage V1 supplied by the low pass filter 20 when the field H varies and passes through Ho. This curve is of the dispersion type, i.e. antisymmetrical, with a positive part, a cancelling out (for the value Ho corresponding to resonance) and a negative part. The knowledge of Ho makes it possible to rise to $(Hm)_D$ if Hb is known.

The apparatus of FIG. 4 is a variant where use is also made of an oscillator 22 and a winding 24 for producing a magnetic field having an audio frequency fm, said field, known as the dither field being superimposed on the polarization field Hb.

Moreover, in the variant of FIG. 4 and at the output of the balanced mixer 18, the low pass filter 20 of FIG. 1 is replaced by a band pass filter 26 centred around the frequency fm. A phase shifter 28 receives the high frequency signal from the generator 6 and supplies a signal of appropriate phase to the balanced mixer 18.

A circuit 30 for synchronous detection at the frequency fm receives on one of its inputs a reference signal from the generator 22. This reference signal has a frequency fm, but its amplitude and phase can be made different from those of the signal supplied by the oscillator 22 to the coil 24. The circuit 30 has another input connected to the output of the filter 26 and finally supplies a voltage Vs.

By fitting at the output of the synchronous detection means 30 an appropriate, not shown, observation means, it is possible to observe the curve of the variations of Vs as a function of the total field H. This curve is shown in FIG. 5. Like that of FIG. 3, it is an antisymmetrical curve with a cancelling out for the value Ho of the field corresponding to the resonance of the spins.

With such apparatuses, a variation of the field to be measured Hm, if it is well below the width of the lines shown in FIGS. 3 and 5, leads to a variation compared with the resonance value and by the appearance of a non-zero voltage (V1 or Vs) at the magnetometer output: This voltage varies substantially linearly as a function of the variation at Ho.

The linearity can be improved by a field feedback obtained by using the voltage V1 (FIG. 3) or the voltage Vs (FIG. 5) as the error signal, by integrating said voltage and by injecting into a feedback coil a current proportional to the integrated voltage. The axis of this feedback coil must be parallel to the direction D of the polarization field.

This can be seen in the diagram of FIG. 6 where, in addition to the means already shown in FIG. 4, there are an integrator 31 and a feedback winding 32. In such an apparatus, the total field is still maintained at the value corresponding to resonance and the integrated error signal constitutes the measurement signal, which appears on the apparatus output 34.

In other words, no matter what the field applied from the outside to the sample, along the direction D the said sample sees the same field, namely that ensuring the resonance of the spins. As the field corresponding to resonance is much larger (more than ten times) than the field having an external origin to be measured, the geometric sum modulus (cf. FIG. 2) is substantially equal to the sum of the field created by the polarization current and directed in accordance with direction D and the projection on said direction of the external field to be measured. In other words, the means 31 and 32 make the apparatus dependent on the resonance, no matter what the field applied from the outside.

In the embodiment illustrated in FIG. 6, it should be also be noted that there are three windings, respectively polarization 3, dither 24 and feedback 32, which are assumed to be separate. However, as they all have the same axis, they can be combined into one and the same winding.

The integrator 31 can either directly supply the feedback current, or can supply a voltage, in which case it is necessary to associate a voltage-current converter with it, e.g. in the form of a resistor.

Thus, according to this prior art, known directional resonance magnetometers generally have a sample with spins subject to the field to be measured, means for applying to said sample a magnetic polarization field, means for applying to the sample a radio frequency field and for exciting the resonance of the spins, means for detecting said resonance, means for producing an antisymmetrical electrical signal which is cancelled out when the total field applied to the sample assumes the value Ho corresponding to the resonance of the spins and which is positive or negative as a function of whether the total field applied is higher or lower than said particular value (Ho). In the absence of a field to be measured, the apparatus is regulated so that it is at resonance. In the presence of a field to be measured, the feedback field reestablishes the resonance and the value of the integrated error signal (or the feedback current) constitutes the measurement of the magnetic field.

The magnetometers described hereinbefore are directional, in the sense that they measure the component of the field in accordance with a preferred direction (being the direction of the polarization field).

If it is wished to know the three components of a field according to three rectangular directions, it is necessary to have three magnetometers with polarization fields oriented in these three directions and to perform three measurements. The corresponding installation is therefore complex, costly and cumbersome.

DESCRIPTION OF THE INVENTION

The present invention aims to obviate these disadvantages. To this end it proposes a single magnetometer, which is able to measure several components of the same magnetic field. In this sense, the magnetometer according to the invention can be referred to as multiaxial.

In practice, the magnetometer according to the invention measures two or three components of a field, respectively according to two or three directions. In the latter case, the three directions are preferably orthogonal in pairs, i.e. form a trihedral.

To obtain this result, the magnetometer according to the invention incorporates means for applying no longer one but several polarization fields to the sample in a sequential manner. For this purpose several windings are provided around the sample with appropriate supply means. The output of the magnetometer is able to sequentially supply the same number of measurement signals as polarization fields are sequentially applied to the sample.

More specifically, the present invention relates to a multiaxial resonance magnetometer comprising:
a sample with spins immersed in a magnetic field to be measured (Hm),
first means for applying to said sample a magnetic polarization field,
second means for exciting the resonance of the spins in the sample,
third means for detecting said resonance,
fourth means for supplying a signal, which is zero when the field applied to the sample has a value (Ho) corresponding to resonance and positive or negative when the field applied differs from this value (Ho), said magnetometer being characterized in that said first means for applying to the sample a magnetic polarization field comprise:
at least two windings having non-parallel axes,
means for the sequential supply of said windings in order to sequentially apply to the sample at least two polarization fields.

Preferably, the sequential supply means of the windings comprise a sequencing circuit able to supply at least two switching signals and at least two measurement control signals and a switching circuit having at least two switches controlled by the switching signals, said switches being inserted between the windings and the supply sources.

The supply sources of the windings can be independent current sources or can be included in other means.

All the means known in the magnetometers of the prior art and described with reference to FIGS. 1 to 6 can be used in the invention, either singly or in combination (means for creating a dither field, feedback means, etc.).

BRIEF DESCRIPTION OF THE DRAWINGS

FIG. 1 shows a variant of a prior art directional resonance magnetometer.

FIG. 2 shows the composition of the different fields present.

FIG. 3 illustrates a dispersion curve around resonance.

DETAILED DESCRIPTION OF AN EMBODIMENT

Throughout the following description, it will be assumed that three polarization fields are sequentially applied to the sample. However, this example is in no way limitative and only two could equally well be applied.

Figure 7:
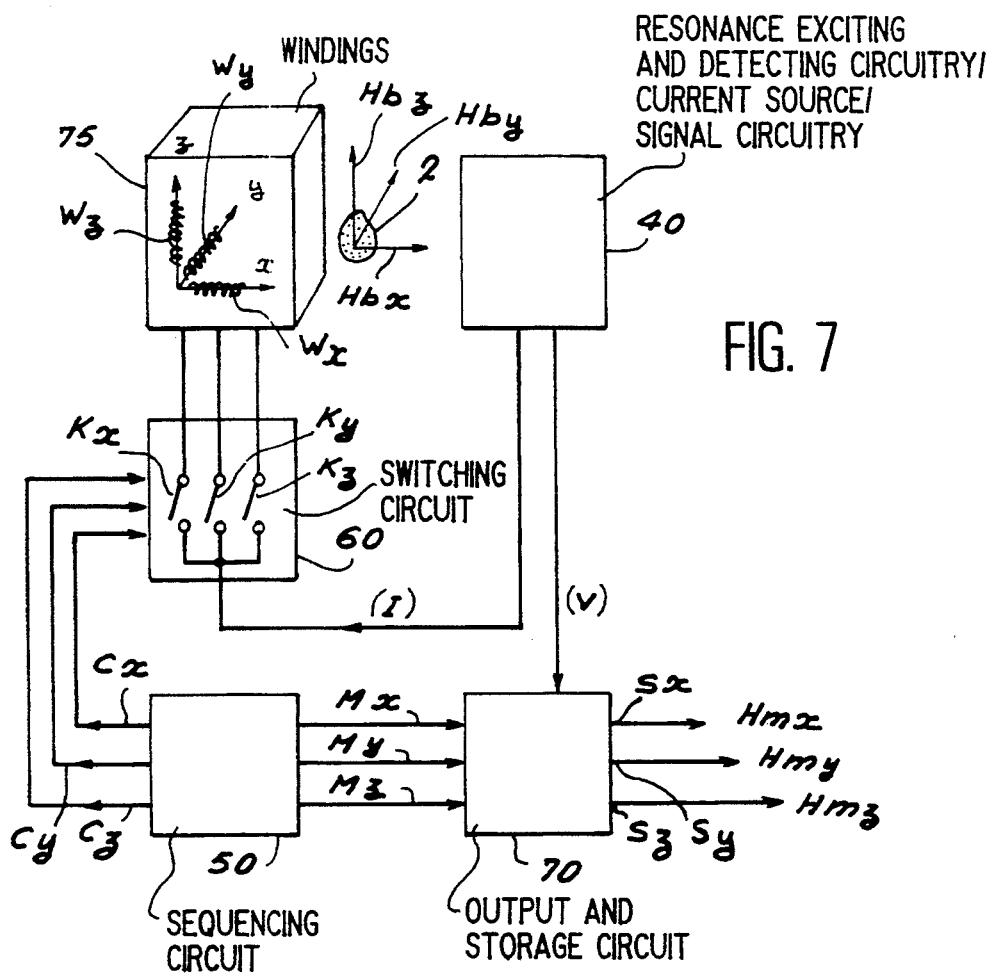
FIG. 7 is a general diagram of a multiaxial magnetometer according to the invention.
Figure 8A:
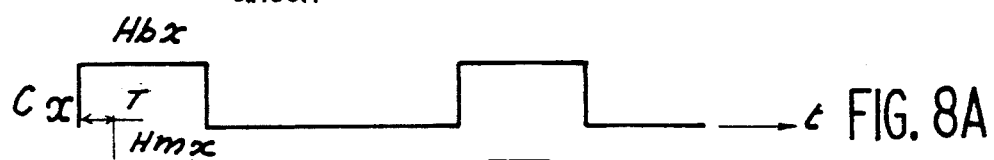
FIG. 8 is a timing diagram illustrating the signals supplied by the sequencer.
Figure 8B:
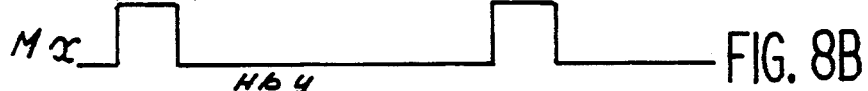
Figure 8C:
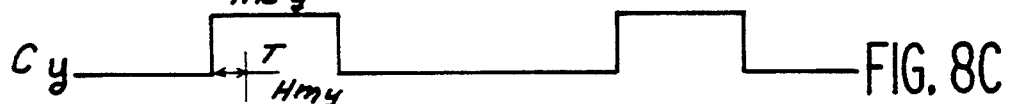
Figure 8D:
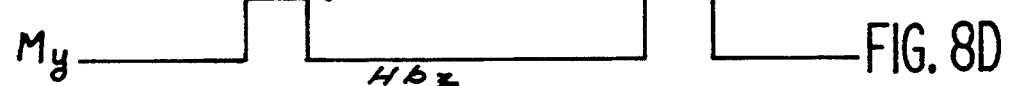
Figure 8E:
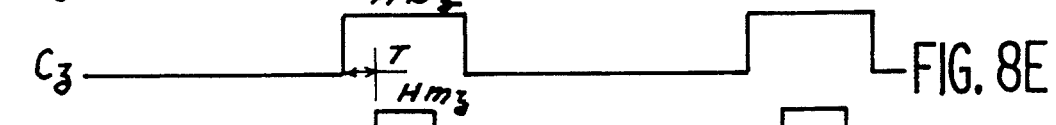
Figure 8F:

FIG. 7 is a general diagram of the magnetometer according to the invention. As shown, the magnetometer has a sample with spins 2 and general means 40 relating to various known means, namely resonance exciting and detecting means, means for forming a supply current I for the polarization windings, if appropriate, dither and/or feedback means, and means for forming a signal V, which is the already described dispersion signal or a feedback signal, on the basis of which it is possible to deduce the value of the magnetic field to be measured.

The magnetometer differs from the prior art by the presence of a sequencing circuit 50, which supplies three switching signals Cx, Cy and Cz and three measurement signals Mx, My and Mz. The magnetometer also has a switching circuit 60 connected to 40 and having three switches Kx, Ky, Kz, whose opening and closing is respectively controlled by the switching signals Cx, Cy and Cz.

The polarization means 75 are constituted by three windings Wx, Wy, Wz forming a trihedral. The three polarization fields obtained are designated Hbx, Hby and Hbz and are directed in three directions, which naturally also form a trihedral. FIG. 7 is diagrammatic, Thus, in reality, the three windings Wx, Wy and Wz surround the sample 2, as will be seen more clearly relative to FIG. 13.

The magnetometer also comprises an output and storage circuit 70, which receives the signal V supplied by the means 40. This output circuit is controlled by the signals Mx, My and Mz supplied by the sequencer 50 and it supplies, on three outputs Sx, Sy and Sz, the three components Hmx, Hmy and Hmz of the field Hm to be measured, in which is immersed the sample 2.

The timing diagram of FIG. 8 provides a better understanding of the operation of said apparatus. On the lines (a), (c) and (e) appear the switching signals Cx, Cy and Cz, which are shown in sequential form. When they are active, they give rise to the appearance of polarization fields Hbx, Hby and Hbz.

On lines (b), (d) and (f) appear the measurement control signals Mx, My, Mz. They are delayed by a time T compared with the signals Cx, Cy, Cz. They make it possible to have components of the field, respectively Hmx, Hmy and Hmz, on the appropriate outputs of the circuit 70.

FIGS. 9 to 12 illustrate four embodiments of the magnetometer according to the invention.

Figure 9:
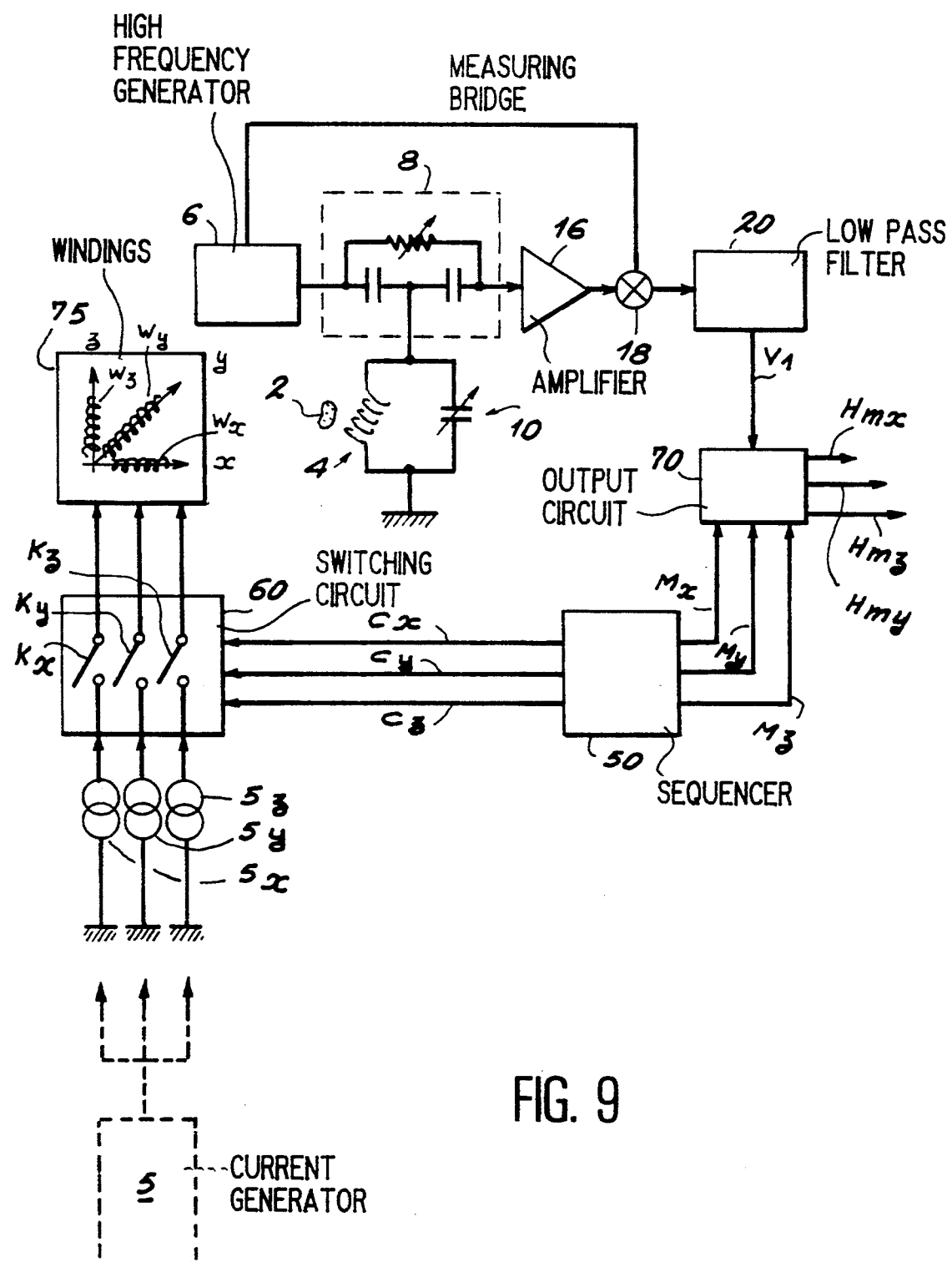
FIG. 9 shows a first simple embodiment of a magnetometer according to the invention.

Firstly FIG. 9 shows a simple variant using means already shown in FIG. 1, namely the resonance exciting and detecting winding 4, the high frequency generator 6, the measuring bridge 8, the resonant circuit 10, the low noise amplifier 16, the balanced mixer 18 and the low pass filter 20 supplying a signal V1.

Moreover and according to the invention, the magnetometer has three current sources 5x, 5y and 5z, a switching circuit 60, an assembly 75 having three windings Wx, Wy and Wz, a sequencer 50 and an output circuit 70 receiving the signal V1 supplied by the low pass filter 20 and supplying the three components Hmx, Hmy and Hmz of the field to be measured. The means 50, 60, 70 operate in the manner described relative to FIGS. 7 and 8.

Figure 4:
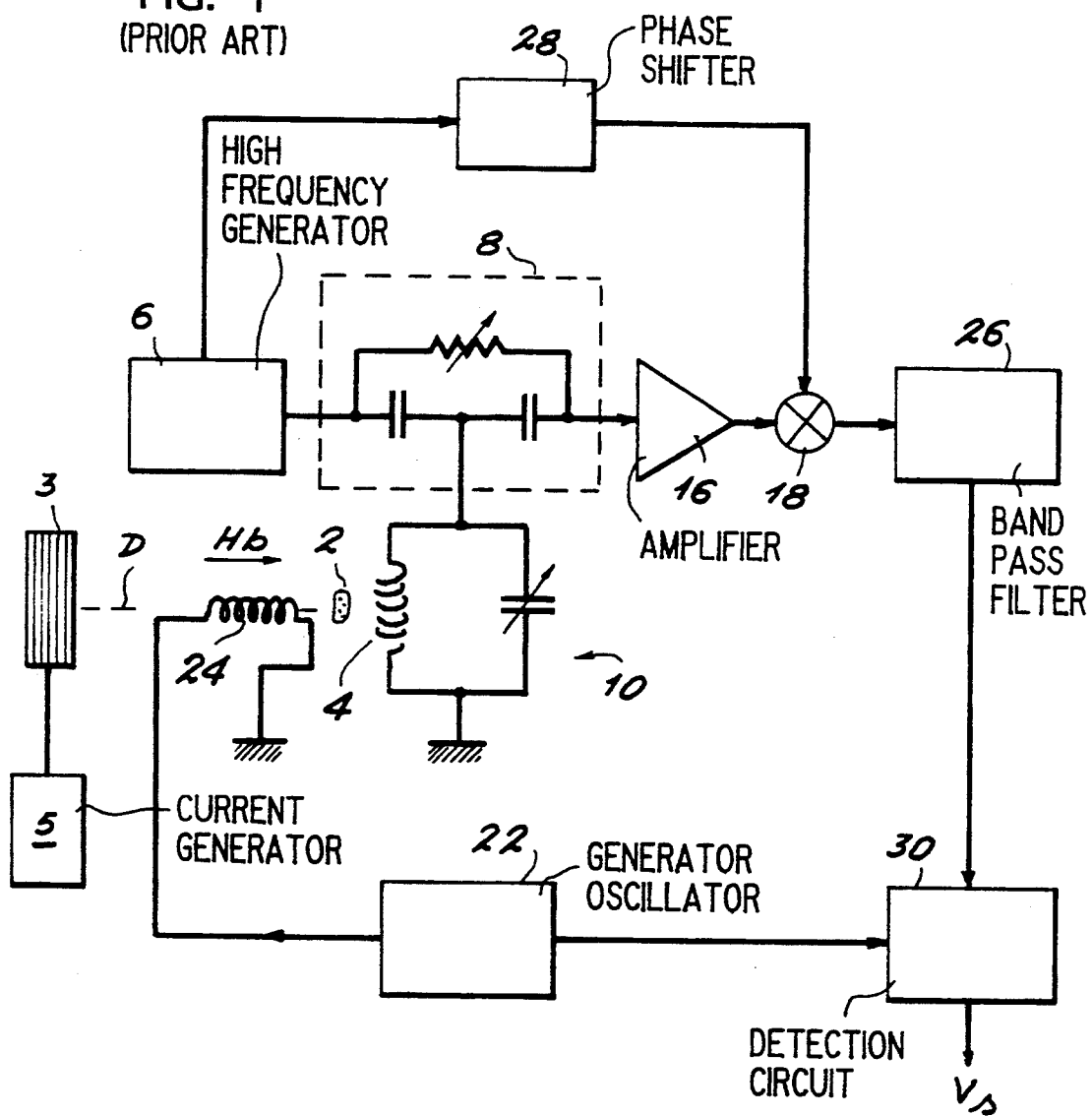
FIG. 4 shows another prior art dither field magnetometer variant.
Figure 5:
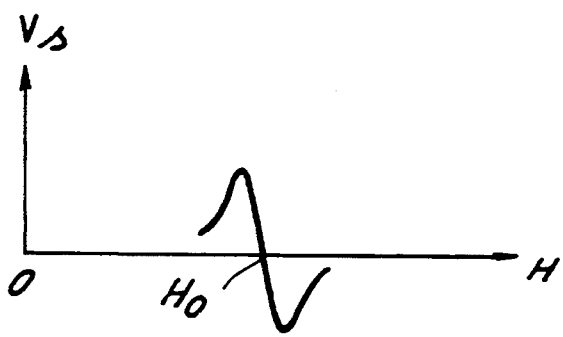
FIG. 5 illustrates the dispersion curve obtained with a magnetometer of the latter type.
Figure 10:
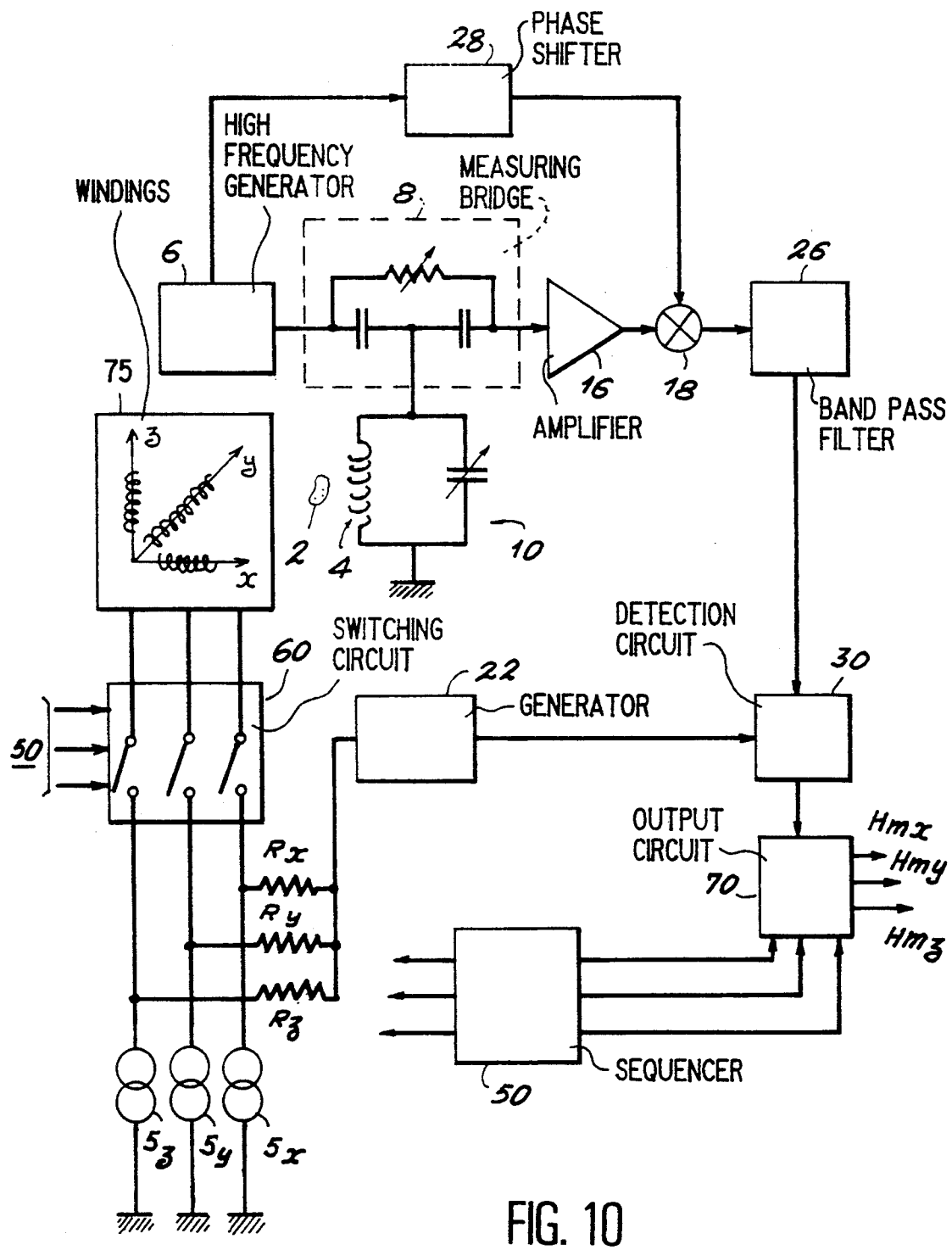
FIG. 10 shows a second, more complex embodiment with a dither field.

The embodiment of FIG. 10 is slightly more complex in that it also has a generator 22 supplying a voltage at an audio frequency and three resistors Rx, Ry and Rz for connecting said generator to the inputs of the switching circuit 60. As for the variant of FIG. 4, at the output of the balanced mixer 18 there is a band pass filter 26 centred around the audio frequency of the generator 22. A synchronous detection circuit 30 receives a reference signal from the generator 22 and the signal supplied by the band pass filter 26. The output circuit 70 once again supplies the three components of the field.

Figure 6:
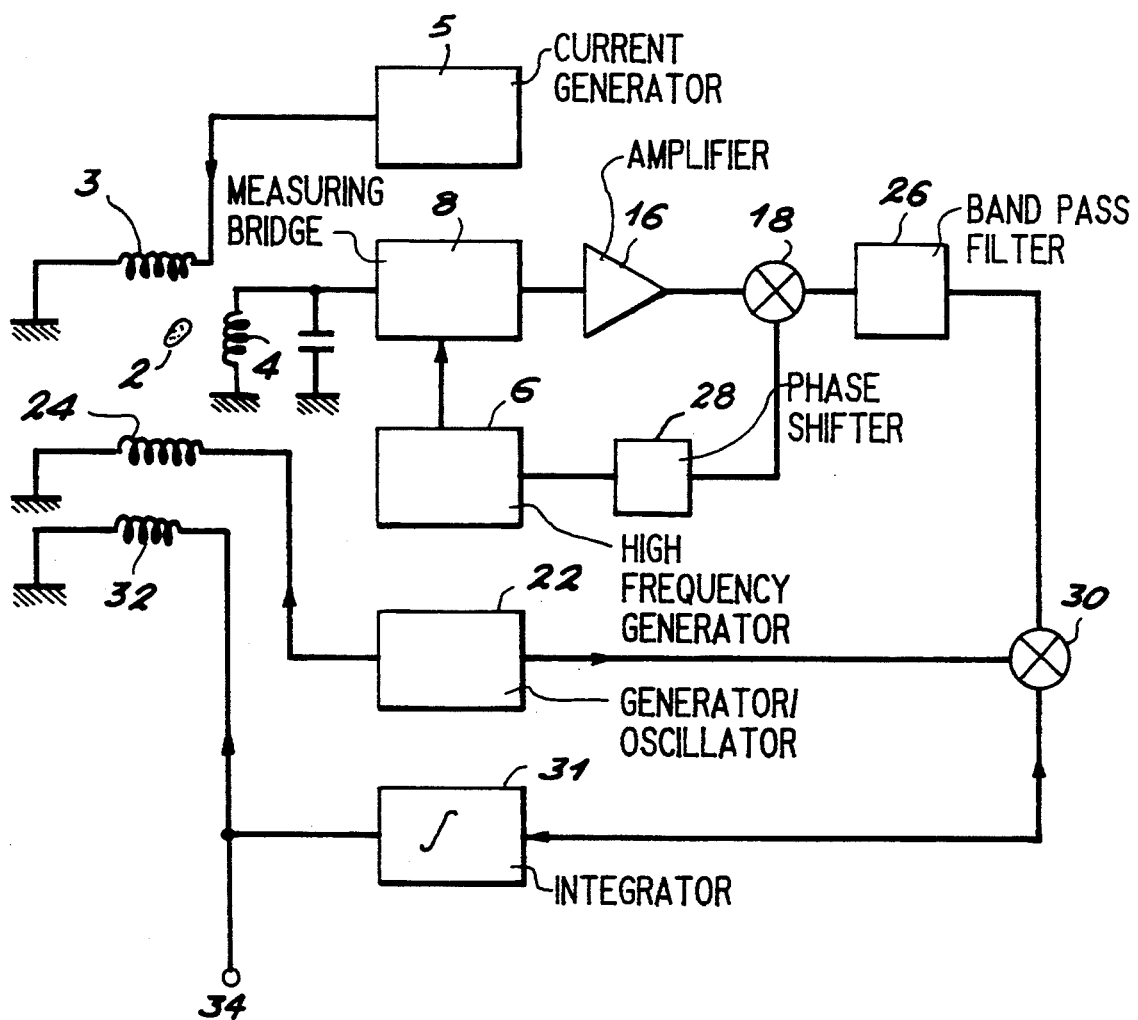
FIG. 6 shows another variant of a prior art magnetometer with a dither field and a feedback field.
Figure 11:
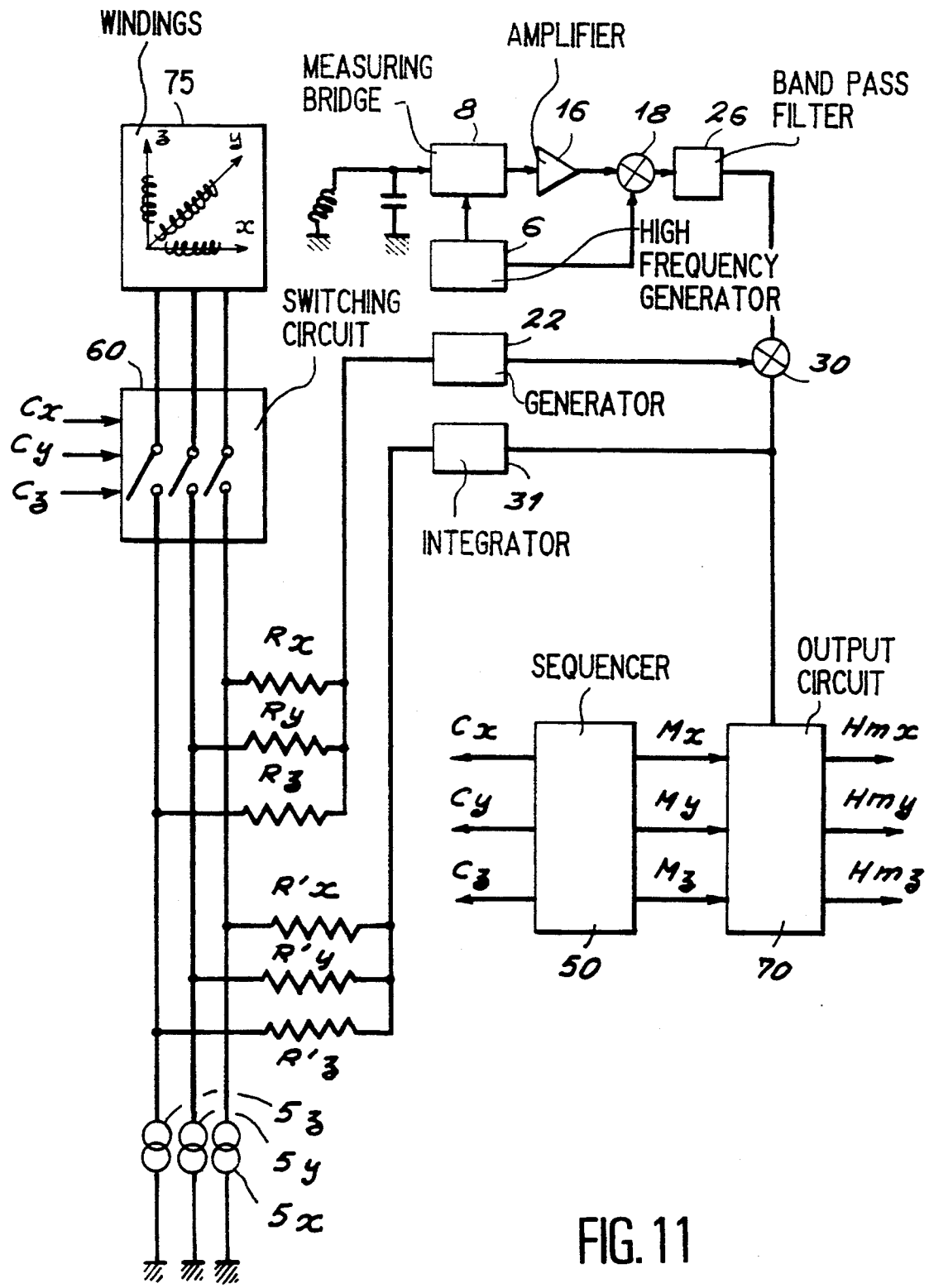
FIG. 11 shows a third, even more complex embodiment with a dither field and a feedback field.

The embodiment illustrated in FIG. 11 is even more complex and corresponds to the feedback dependency variant of FIG. 6. In addition to the apparatus of FIG. 10, it has an integrator 31 and three resistors R'x, R'y and R'z connecting said integrator to the switching circuit 60. The output circuit 70 receives the feedback voltage on an input, the three control signals Mx, My and Mz and supplies the three components Hmx, Hmy and Hmz.

Figure 12:
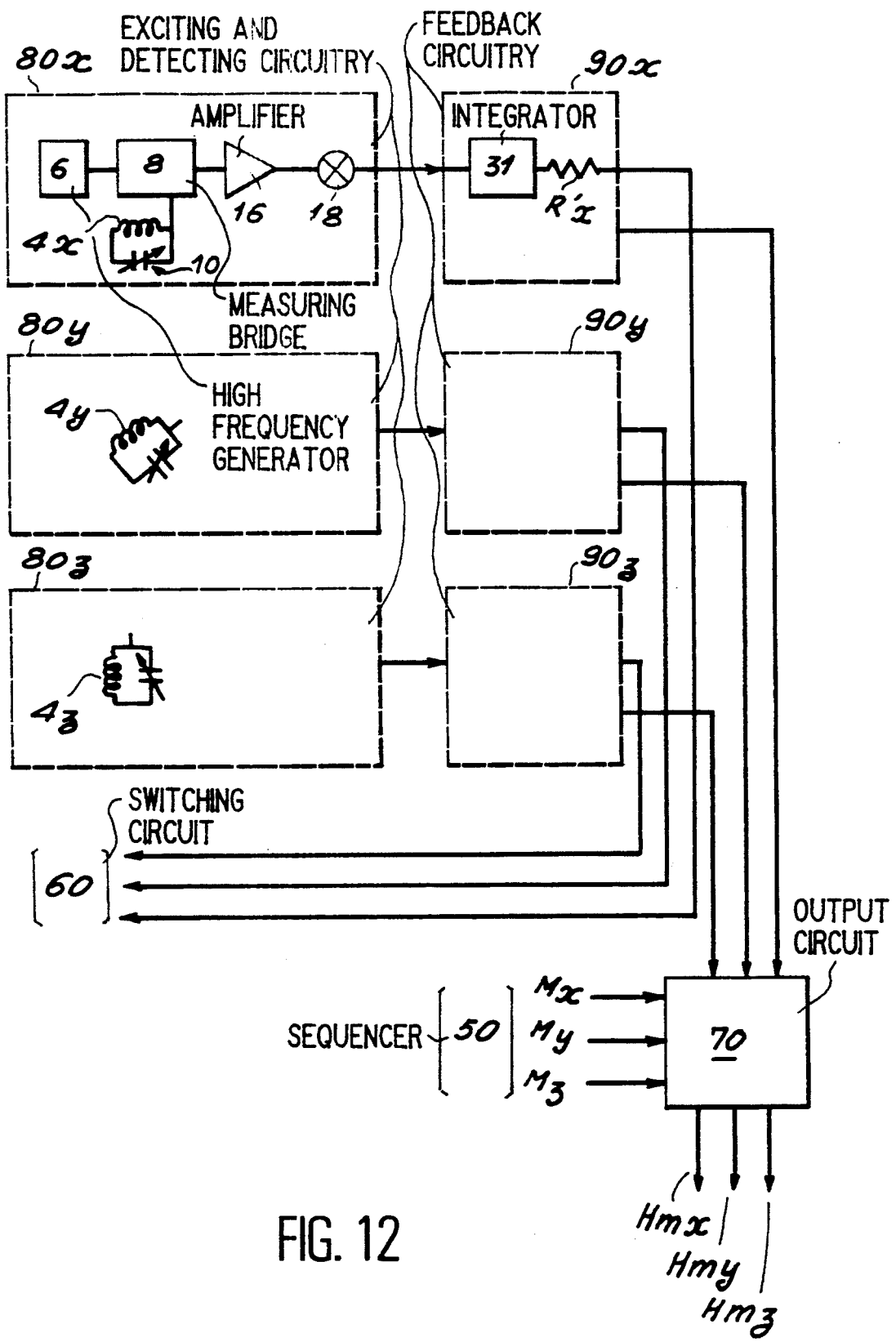
FIG. 12 shows a fourth embodiment of a magnetometer according to the invention having several means for exciting and detecting resonance.

In the preceding variants, the magnetometer only has a single resonance exciting and detecting winding, namely the winding 4. However, in order to improve the signal to noise ratio, it is possible to use several exciting and detecting windings oriented in different directions. This is shown in FIG. 12, where there are three blocks 80x, 80y and 80z each having the same means 6, 8, 10, 16, 18 described hereinbefore and windings 4x, 4y, 4z oriented in accordance with three different axes. The magnetometer also has three feedback circuits 90x, 90y and 90z each with an integrator 31 and a resistor R'. The three feedback signals are applied to the output circuit 70, as in the other embodiments.

Figure 13:
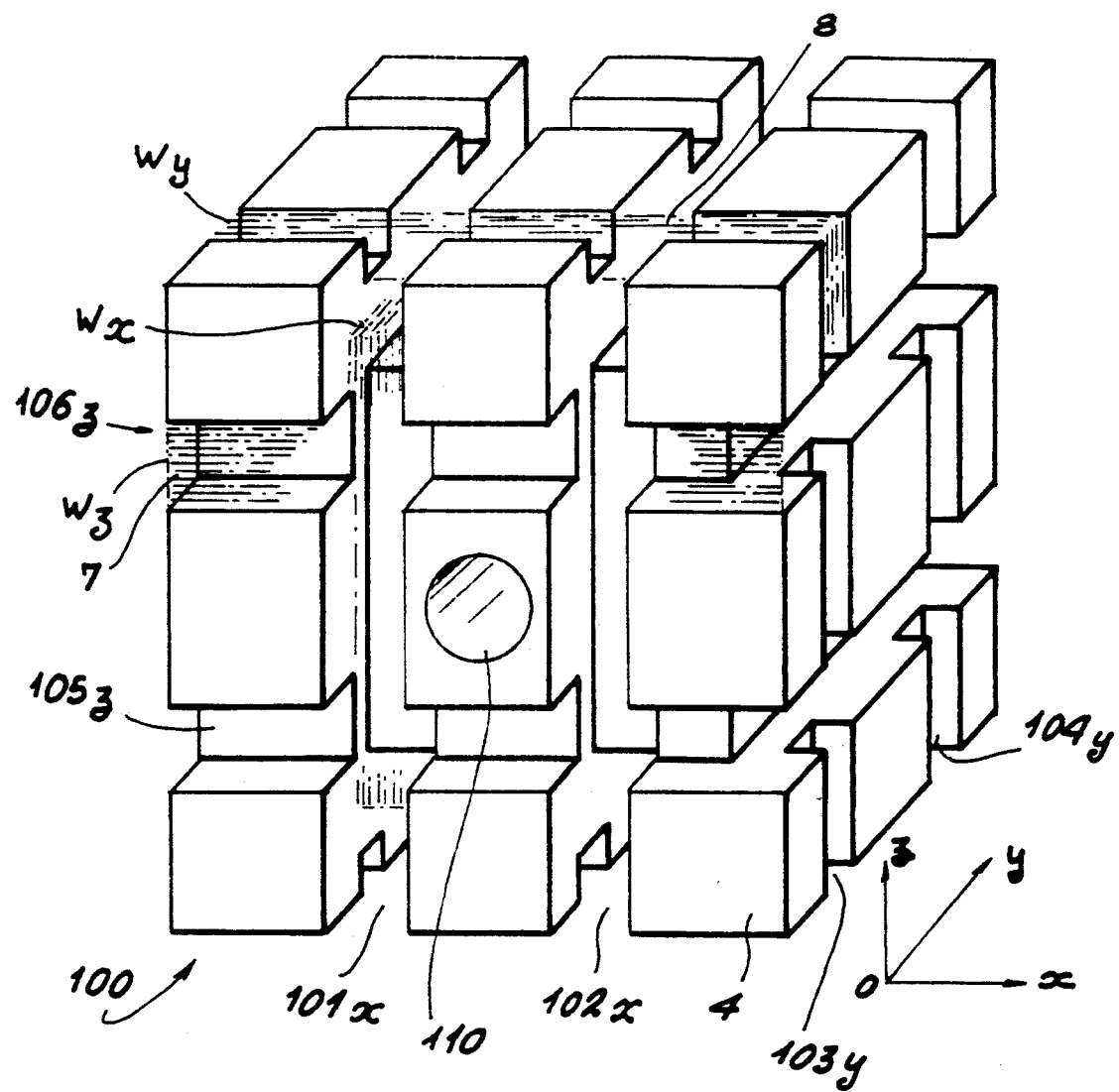
FIG. 13 illustrates a triple winding produced on a cube.

FIG. 13 shows a block 100 making it possible to coil three windings Wx, Wy, Wz having orthogonal axes x, y, z.

Two notches 101x and 102x have their axis parallel to Ox, two notches 103y, 104y have their axis parallel to Oy and two notches 105z, 106z have their axis parallel to Oz. An insulated conductor wire is coiled in its notches and forms overlapping windings. The three fields created by these three double windings are homogeneous, on advantageously respecting the condition $Z = 0.5545 A$, in which A designates the average size of a groove and Z the distance between two grooves along an axis. The hole 110 makes it possible to introduce the sample and its exciting and detecting winding.

The following table gives a few possible characteristics for a cube coiled with a diameter 70 μm wire:

| Axis | y | z | x |
|---|---|---|---|
| Mean half-side of groove | 7 mm | 6 mm | 5 mm |
| Mean distance between grooves | 3.81 mm | 3.27 mm | 2.72 mm |
| Number of turns | 312 | 312 | 312 |
| Resistance | 73 Ω | 62 Ω | 52 Ω |
| Current | 39 mA | 34 mA | 28 mA |

The indicated current corresponds to 1.43 mT (which corresponds to 40 HMz for the resonance of electron spins).

Figure 14:
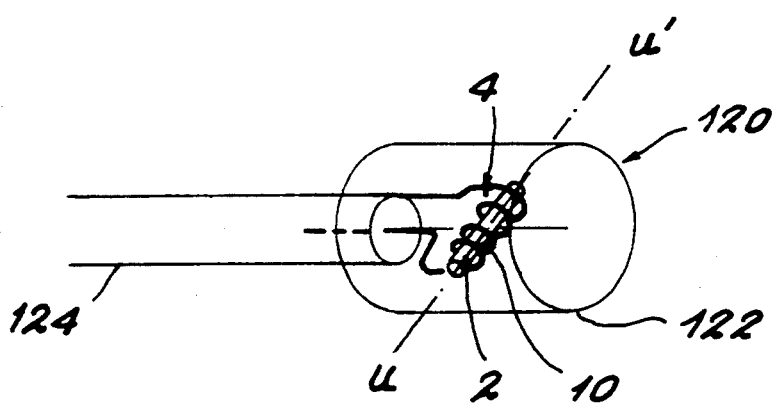
FIG. 14 shows a resonance exciting and detecting winding.

Finally, FIG. 14 shows a means for introducing the sample with spins into the cube. Once again the sample is 2 and the resonance exciting and detecting winding 4. The assembly can be embedded in a resin or an adhesive for better mechanical holding purposes. Everything can be surrounded by an electro-magnetic shield 122. The assembly has a limited volume and an external cylindrical surface, whose diameter is slightly smaller than the diameter of the hole 110 in the cube 100 of FIG. 13, which permits its introduction. The winding 4 is also connected to a coaxial connection cable 124 to the bridge 8 (cf. FIG. 1).

I claim:

1. A multiaxial resonance magnetometer, comprising:
   a sample with spins immersed in a magnetic field to be measured, first means for applying to said sample a magnetic polarization field, second means for exciting the resonance of the spins in the sample, third means for detecting said resonance, fourth means for supplying a signal which is zero when the field applied to the sample has a value corresponding to resonance and positive or negative when the field applied differs from said value, wherein said first means for applying to the sample a magnetic polarization field comprises:

a plurality of windings having non-parallel axes, each of said non-parallel axes being oriented in a corresponding direction for measurement of a component of said magnetic field in said corresponding direction, and means for the selective supply of current to said plurality of windings in order to selectively apply to the sample a plurality of magnetic polarization fields, each of said plurality of magnetic polarization fields being respectively oriented in a corresponding direction of one of said non-parallel axes to measure a component of said magnetic field in the corresponding direction.

2. The Magnetometer according to claim 1, wherein said means for the selective supply of current to said plurality of windings comprises: a sequencing circuit able to supply a plurality of switching signals and a corresponding plurality of measurement control signals; and a switching circuit comprising a plurality of switches each controlled by a respective one of said plurality of switching signals, said plurality of switches being respectively positioned between said plurality of windings and a current supply source.

3. The magnetometer according to claim 2, further comprising: an output and storage circuit respectively controlled by said plurality of measurement control signals supplied by said sequencing circuit, said output and storage circuit receiving the signal supplied by said fourth means and sequentially supplying on at least two outputs measurement signals corresponding to the different components of the magnetic field to be respectively measured on the different directions of said plurality of magnetic polarization fields.

4. The magnetometer according to claim 2, further comprising: dither means able to create a dither field, said dither means comprising an audio frequency generator respectively operably connected by a corresponding plurality of connecting resistors to said plurality of switches of said switching circuit.

5. The magnetometer according to claim 2, further comprising: feedback means connected to said switching circuit.

6. The magnetometer according to claim 1, further comprising: a plurality of said second means and a plurality of said third means.

7. The magnetometer according to claim 6, further comprising a plurality of feedback means, each of said plurality of feedback means being respectively associated with one of said plurality of second means and one of said plurality of third means, said plurality of feedback means being connected to a switching circuit, said switching circuit selectively supplying current to said plurality of windings.

* * * * *